United States Patent
Zortea et al.

(10) Patent No.: US 6,642,801 B1
(45) Date of Patent: Nov. 4, 2003

(54) OSCILLATOR USING VIRTUAL STAGES FOR MULTI-GIGABIT CLOCK RECOVERY

(75) Inventors: Anthony Eugene Zortea, Pipersville, PA (US); Todd Wey, Schwenksville, PA (US)

(73) Assignee: 3Com Corporation, Santa Clara, CA (US)

( * ) Notice: Subject to any disclaimer, the term of this patent is extended or adjusted under 35 U.S.C. 154(b) by 123 days.

(21) Appl. No.: 09/933,654

(22) Filed: Aug. 21, 2001

(51) Int. Cl.[7] .............................................. H03B 27/00
(52) U.S. Cl. .......................... 331/57; 331/1 A; 455/260
(58) Field of Search ..................... 331/1 A, 57; 455/260

(56) References Cited

U.S. PATENT DOCUMENTS

| | | | | |
|---|---|---|---|---|
| 5,126,691 A | * | 6/1992 | Mijuskovic et al. | 331/1 A |
| 5,331,295 A | * | 7/1994 | Jelinek et al. | 331/57 |
| 5,812,626 A | * | 9/1998 | Kusumoto et al. | 377/20 |
| 5,828,717 A | * | 10/1998 | Kusumoto et al. | 377/24 |
| 5,847,617 A | * | 12/1998 | Reddy et al. | 331/57 |
| 5,929,714 A | * | 7/1999 | Nakamura | 331/57 |
| 5,999,586 A | * | 12/1999 | Terada et al. | 377/20 |
| 6,396,312 B1 | * | 5/2002 | Shepston et al. | 327/105 |
| 6,452,430 B1 | * | 9/2002 | Tung et al. | 327/156 |

OTHER PUBLICATIONS

B. Razavi, Chapter 7, "Oscillators", RF Microelectronics (● 1998, Prentice Hall, Inc.), pp. 206–226.
B. Razavi, Chapter 14, "Oscillators", Design of Analog CMOS Integrated Circuits, (● 2001, The McGraw Hill Companies), pp. 482–494.

* cited by examiner

Primary Examiner—Michael Tokar
Assistant Examiner—Khai Nguyen
(74) Attorney, Agent, or Firm—Michaelson & Wallace; Peter L. Michaelson (57) ABSTRACT

In a high speed digital communication receiver, an n-stage oscillator of frequency f has a plurality of n stages with n variable analog delays connected to respective ones of the n stages, outputs of the n variable analog delays providing n successive cycles of a clock signal of frequency n×f. A delay control circuit varies the delay interposed by each of the variable delays through a range of 1/(n×f). The delay control circuit can vary the delay in m equal steps, whereby the oscillator exhibits n×m virtual oscillator stages, so that the oscillator provides a phase resolution of 1/(m×n×f).

14 Claims, 6 Drawing Sheets

OSCILLATOR USING VIRTUAL STAGES FOR MULTI-GIGABIT CLOCK RECOVERY

BACKGROUND OF THE INVENTION

1. Technical Field

The invention is related to clock recovery circuits for multi-Gigabit digital communication system, and in particular to oscillators used by such clock recovery circuits.

2. Background Art

A receiver in a digital communication system employs a clock recovery circuit to reconstruct the clock signal embedded in the received signal. The receiver uses a control loop to maintain frequency and phase lock with the embedded clock signal. Some clock recovery systems use the output of a local oscillator that is not locked to the embedded clock in order to create the recovered clock signal. Such a clock recovery system operates in a feedback loop that is independent of the local oscillator. The local oscillator is neither frequency nor phase locked to the embedded clock signal, so that the phase of the local oscillator constantly rotates relative to the embedded clock signal. The rate at which the phase rotates is proportional to the difference between the received signal's embedded clock signal and the frequency of the local oscillator. The frequency difference is compensated by the clock recovery system rotating the phase of the local oscillator output accordingly, so as to maintain frequency lock. For this purpose, the local oscillator can be a multi-stage ring oscillator, i.e., having n stages. The rotation of the phase of its output is performed by selecting successively different oscillator stages as the output.

In multi-Gigabit digital communications, the frequencies are so high that the cost of components such as a multi-GigaHertz local oscillator can be prohibitively high. It is not practical to make a multi-GigaHertz local oscillator using ordinary Silicon integrated circuit structures and processes, and far more expensive structures and processes, such as Germanium, must be employed. One way around this might be to use successive stages of a multi-stage local oscillator as successive phases of the recovered clock signal. For example, if the embedded clock in the received signal is 25 Gigabits/second, and if the local oscillator is a ring oscillator having 10 stages, then the local oscillator could be designed to run at 2.5 Gigabits/second and each of the 10 stages would output the leading edge of a corresponding one of 10 successive phases of a 25 Gigabit/second clock signal. The advantage here is that a 2.5 Gigabit/second oscillator can be fabricated in standard Silicon processes and therefore can be very inexpensive.

This would be only a partial solution: No provision has been made to rotate the phase of the local oscillator output to maintain frequency lock with the received signal's embedded clock. This is because there are no spare local oscillator stages, each stage being used to provide one of ten phases of the recovered clock signal. In the foregoing example, spare stages could be provided by quintupling the number of stages (i.e., so that there are now 50 stages of the local oscillator). In this case, each of the ten phases of the clock signal would be derived from every fifth local oscillator stage, and the phase may be rotated in increments of one-fifth of the clock period. Even this is only a partial solution, because incrementing (or decrementing) the local oscillator output phase by one-fifth of the clock period involves such a large change that it induces jitter in the clock signal, which can disrupt communication. In order to reduce such jitter or phase noise, the "phase resolution" of the local oscillator must be increased by increasing the number of stages of the local oscillator even further. In the foregoing example, the number of local oscillator stages can be increased to one hundred, so that the ten phases of the recovered clock signal would be derived from every tenth local oscillator stage, and the phase could be rotated in increments of one-tenth of the clock period. This would reduce the jitter, and even better reductions in jitter could be attained by ever expanding numbers of local oscillator stages. For example, very fine phase resolution could be obtained by using a local oscillator having a thousand stages. In the foregoing example, a one-thousand stage oscillator would mean that each of the ten phases of the recovered clock would be derived from every one hundred stages, and the phase would be rotated in increments of one-hundredth of a clock period. However, at this point the cost of the oscillator will have far exceeded any practical commercial limits, and the physics of semiconductors limits the number of ring oscillator stages possible for a given oscillator frequency.

Thus, it has seemed that digital communication systems operating at multi-Gigabit/second rates must necessarily involve a compromise between cost and performance, the cost being entailed in the number of local ring oscillator stages and the performance being limited by the clock jitter that worsens as the number of stages is reduced. It would be desirable to achieve optimum performance (e.g., achieving unlimited phase resolution in the local oscillator) without increasing cost (e.g., without having to increase the number of oscillator stages) while permitting the oscillator to run at least an order of magnitude below the embedded clock signal rate.

SUMMARY OF THE INVENTION

In a high speed digital communication receiver, an oscillator of oscillator frequency f has a plurality of n stages connected serially having a delay of $1/(n \times f)$ between successive stages. A plurality of n variable analog delays are connected to respective ones of the n stages, outputs of the n variable analog delays providing n successive cycles of a clock signal of frequency $n \times f$. A delay control circuit varies the delay interposed by each of the variable delays through a range of $1/(n \times f)$. The apparatus delay control circuit can vary the delay in m equal steps, whereby the oscillator exhibits $n \times m$ virtual oscillator stages, so that the oscillator provides a phase resolution of $1/(m \times n \times f)$. A series-to-parallel converter has a first set of inputs to which outputs of the variable analog delays are connected and a second input to which a received signal is connected. A clock recovery circuit responds to an embedded clock signal within the received signal to control the delay control circuit so as to frequency-lock the outputs of the variable analog delays to the embedded clock signal. A phase comparator has a pair of inputs and an output connected to the delay control circuit, one of the phase comparator inputs being connected to an output of a selected one of the variable analog delays and the other of the phase comparator inputs being connected to one of the oscillator stages. The delay control circuit is programmed to return each of the variable analog delays to an initial delay value after the phase of the output of each variable analog delay reaches the phase of an adjacent oscillator stage, as sensed by the comparator.

BRIEF DESCRIPTION OF THE DRAWINGS

FIG. 7 is a schematic diagram illustrating the embodiment of which FIG. 1 illustrates a portion.

DETAILED DESCRIPTION OF PREFERRED EMBODIMENTS

Introduction

The invention solves the problem of providing an extremely high phase resolution without having to increase the number of local oscillator stages by providing many (n) virtual oscillator stages between each successive pair of real oscillator stages. In the invention, the number of virtual oscillator stages is theoretically unlimited. The invention accomplishes this by implementing the n virtual oscillator stages as a continuously variable analog delay at the output of each real oscillator stage. Each variable analog delay is controlled so as to mimic the phase of any one of the n virtual stages between the corresponding pair of real stages. Thus, the required range of phase delay of each variable analog delay is the phase difference between each pair of real local oscillator stages. (For a local oscillator running at a frequency F and having M real stages, the phase difference and therefore the phase delay range of each analog delay is 1/MF.

This latter feature requires that as each variable analog delay reaches the maximum phase delay in this range, it returns to zero phase delay, if the phase rotation is in the direction of increasing phase delay. Conversely, in the case of phase rotation in the direction of decreasing phase delay, as each variable analog delay reaches the minimum phase delay in the range, it must return to the maximum phase delay, 1/MF. In one embodiment, this is accomplished automatically by a differential phase comparator that monitors the phase difference of the variable analog delay and the phase of the adjacent oscillator stage.

First Exemplary Embodiment

Figure 1:
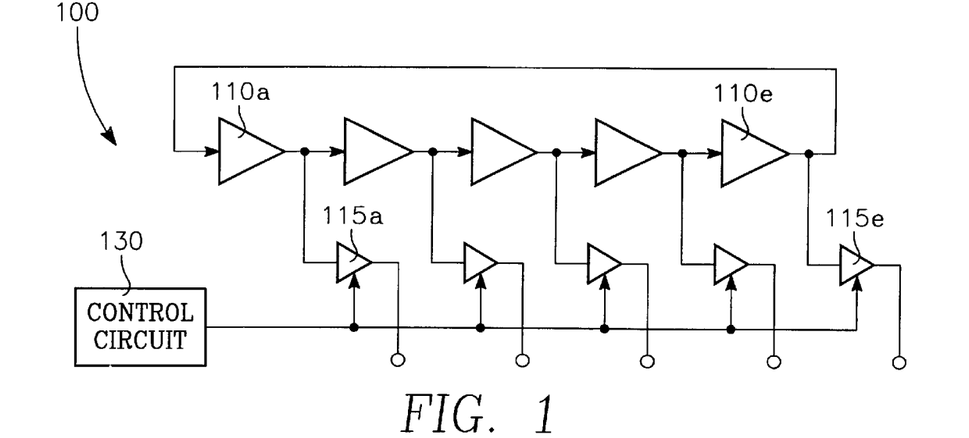
FIG. 1 is a schematic diagram of a portion of a first embodiment of the invention.

Referring now to FIG. 1, a ring oscillator 100 operating at a frequency of $f_0$ has n stages 110$a$–110$e$, where n=5, each stage 110 being an inverter, the output of each inverter being connected to the input of the next inverter to the right in the drawing, the output of the last inverter 110$e$ being connected to the input to the first inverter 110$a$. The outputs of the stages 110$a$–110$e$ are connected to controllable analog delays 115$a$–115$e$. Each analog delay 115 may be set to any phase delay between zero and the phase difference between successive stages, namely 1/n$f_0$. Each analog delay 115 can assume the role of any one of a very large number of virtual oscillator stages between two successive real stages 110. If each analog delay is continuously variable, then the number of virtual stages between successive pairs of stages 110 is theoretically infinite. However, in accordance with practical design considerations, the number of virtual stages, m, should be set to some finite number such as 10, or 50 or 100 or other suitable value. A control circuit 130 sets each analog delay element to a phase delay corresponding to a selected one of the m virtual stages.

The oscillator 100 may be used as the local oscillator of a digital communication system operating at 25 Gigabits per second, with each of the n stages 110 providing a successive cycle of a 25 Gigabit per second recovered clock signal, for example. In this case, the local oscillator frequency must be $$f_0 = [25 \text{ GHz}]/n = 5 \text{ GHz}$$

Thus, the required frequency of the local oscillator 100 is reduced according to the number n of its real stages 110 so that it produces an "augmented" frequency according to the number of stages n. In the present example, the phase difference between successive stages 110 is $\frac{1}{25}$ GHz=400 picoseconds. If the number of virtual stages between adjacent fixed stages 110 is chosen to be m=100 (for a total of 500 virtual stages!), then the phase resolution between "successive" virtual stages is:

$$400 \text{ picoseconds}/m = 4 \text{ picoseconds}$$

The range of the phase delay of each analog delay 115 is zero to 400 picoseconds and is varied in 100 steps of 4 picoseconds each.

Figure 2:
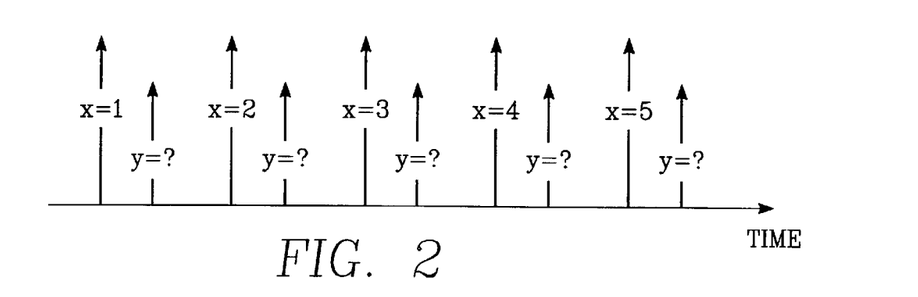
FIG. 2 is a timing diagram illustrating the operation of the embodiment of FIG. 1.

The situation is illustrated figuratively in the timing diagram of FIG. 2. There are five equally spaced stationary phases x1, x2, x3, x4, x5 corresponding to the stationary phases of the five local oscillator stages 110$a$–110$e$. In addition, between each pair of successive phases, there is a variable phase y. Thus, there are five variable phases y corresponding to the five variable analog delays 115$a$–115$e$. Each variable phase y can range anywhere between the phases of the stationary phase pair that it lies between. Thus for example, the variable phase y lying between x1 and x2 can vary between the stationary phase x1 (corresponding to the first stage 110$a$) and the stationary phase x2 (corresponding to the second stage 110$b$). In the foregoing example of a 25 Gb/s clock rate using a 5 Gb/s 5-stage local oscillator, the variable phase of each analog delay 115 would be rotated by the control circuit 130 in 100 4-picosecond steps, as explained above. This would be necessary when using the local oscillator 100 to track an embedded clock frequency $f_{rcvd\ in}$ the received signal that is slightly greater or less than the "augmented" local oscillator frequency fosc produced by sampling the five stages in parallel.

Figure 3:
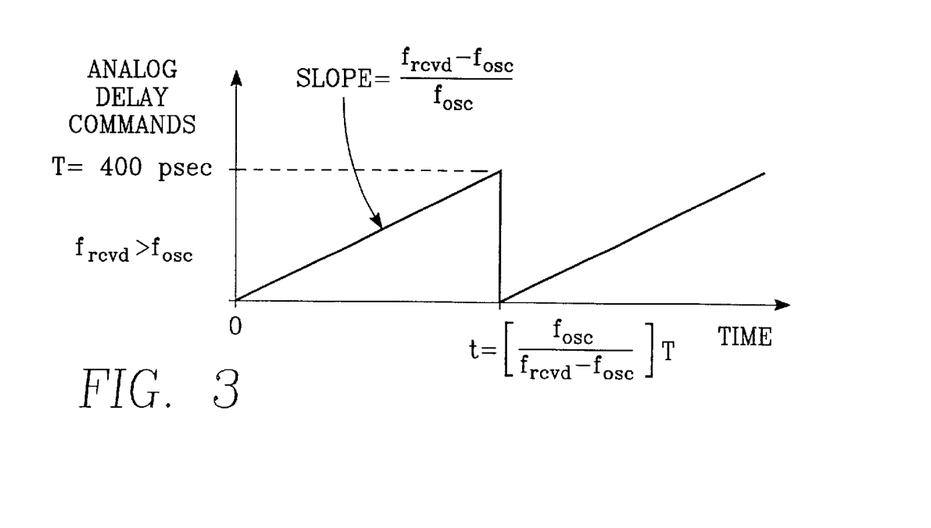
FIG. 3 is a timing diagram of the operation of the embodiment of FIG. 1 in accordance with a first mode.

For example, if $f_{rcvd}$ exceeds $f_{osc}$, then the control circuit 130 would advance the phase at each variable delay 115 at a rate proportional to the difference between the frequencies, as illustrated in FIG. 3. In the example of the analog delay 115$a$ between the first stage 110$a$ and the second stage 110$b$, the variable phase would increase in 4 picosecond steps from the stationary phase of the stage 110$a$ until at time t, at 100 steps, the variable phase reaches the stationary phase of the next stage 110$b$, at which point it returns to the phase of the first stage 110$a$.

Figure 4:
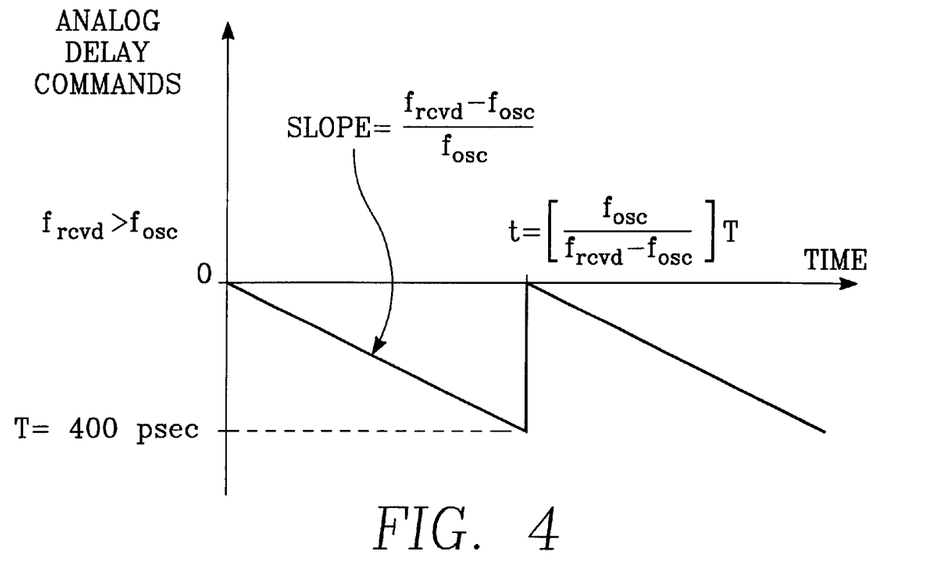
FIG. 4 is a timing diagram of the operation of the embodiment of FIG. 1 in accordance with a second mode.

The reverse situation is illustrated in FIG. 4 in which the embedded clock frequency $f_{rcvd}$ is less than the "augmented" oscillator frequency $f_{osc}$, so that the phase must be decremented rather than incremented. In the example of the analog delay 115$a$ between the first stage 110$a$ and the second stage 110$b$, the variable phase would decrease in 4 picosecond steps from the stationary phase of the second stage 110$b$ until at time t, at 100 steps, the variable phase reaches the stationary phase of the first stage 110$a$, at which point it returns to the phase of the second stage 110$b$. Thus, in either case, the phases of each analog delay 115 must be either decremented or incremented in a cyclic count with the modulus being the phase delay between adjacent fixed stages 110. In the foregoing example, the modulus is 400 picoseconds. Thus, each sawtooth waveform of FIGS. 3 and 4 peaks at 400 picoseconds phase delay. The period of the sawtooth waveform is:

$$t = f_{osc}/[f_{rcvd} - f_{osc}]$$

The slope of each sawtooth waveform is $[f_{rcvd} - f_{osc}]/f_{osc}$

One problem is how to precisely control each analog delay 115 so as to return it to "zero" after it reaches the end of the range in the manner illustrated in FIGS. 3 and 4. The problem exists because the control circuit 130 is locked to the embedded clock of the received signal in order to enable clock recovery, and is not locked to the local oscillator 100. Thus, the control circuit 130 cannot know when time t is reached and therefore cannot determine when to return the analog delay back to its initial state.

This problem is solved by providing for (or within) the control circuit 130 a differential phase comparator responsive to the phase of a selected one of the analog delays 115 and the phase of an adjacent one of the fixed stages 110. Whenever a phase match occurs (which happens at time t of FIG. 3 or 4), the differential comparator informs the control circuit 130, which then returns the analog delay 115 to its initial state. Such a differential comparator is illustrated in FIG. 5.

Figure 5:
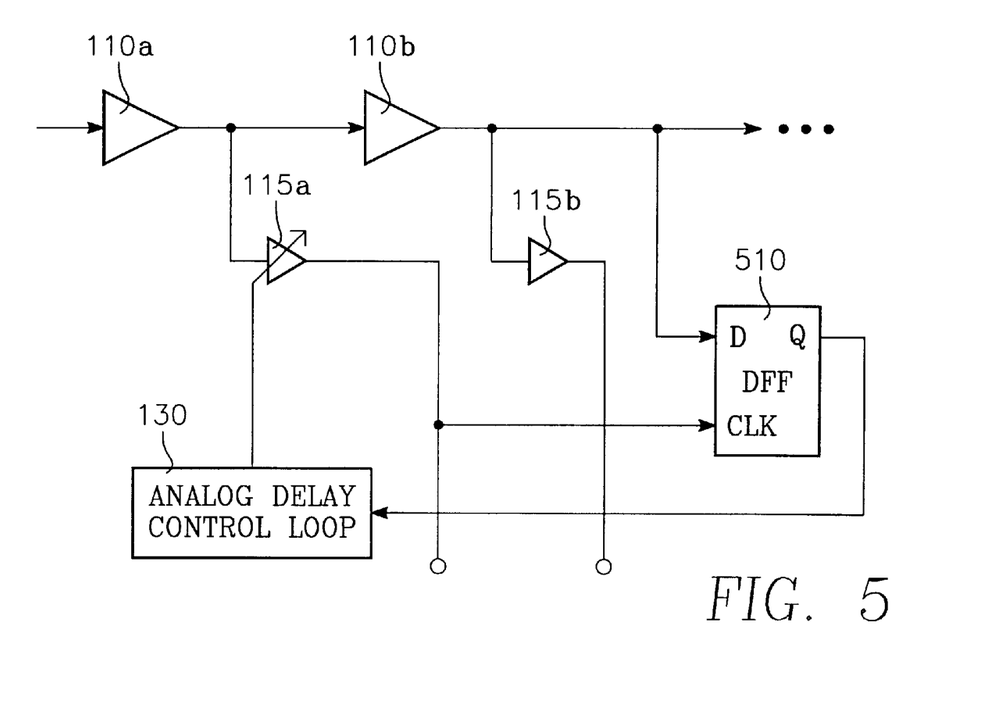
FIG. 5 illustrates a component circuit that may be used with in the embodiment of FIG. 1.

Referring to FIG. 5, the output of the variable analog delay 115a (for example) is applied to the clock input of a D flip-flop 510, while the output of the next fixed stage 110b is applied to the D input of the flip-flop 510. The Q output of the flip-flop 510 goes high only when the phase of the variable analog delay 115a reaches the phase of the next stage 110b (which occurs at time t of FIG. 3), and is applied to a control input of the control circuit 130 to cause it to re-initialized the delay of the analog delay 115a. Only one of the analog delays 115 needs be monitored, provided the control circuit 130 slews all of the analog delays 115a–115e together in concert so that they all reach their end of variable phase range simultaneously at time t.

The control circuit 130 may be implemented, for example, as a microprocessor programmed to apply commands to the variable analog delays 115a–115e that determine the amount of delay interposed by each delay 115. Such a command would be the same for all delays 115a–115e provided they are to be operated in concert as referred to above. The command could be, for example, an N-bit word that encodes defining the desired amount of delay. In the operation illustrated in FIGS. 3 and 4, such a word would be incremented or decremented in value at a rate that determines the slope of the sawtooth wave of FIG. 3 or 4, as discussed above in detail. Thus, the vertical axis of FIG. 3 or 4 corresponds to the value of such an N-bit word. As soon as the phase comparator circuit of FIG. 5 sends a logic high signal to the control circuit 130 (which occurs at time t of FIG. 3 or 4), the control circuit 130 returns the N-bit command word to its initial value. Thus, a microprocessor implementing the control circuit 130 would be programmed to perform the functions illustrated in FIGS. 3 and 4 in response to a conventional clock recovery circuit, so as to maintain frequency lock with a clock signal embedded in a received signal.

Figure 6A:
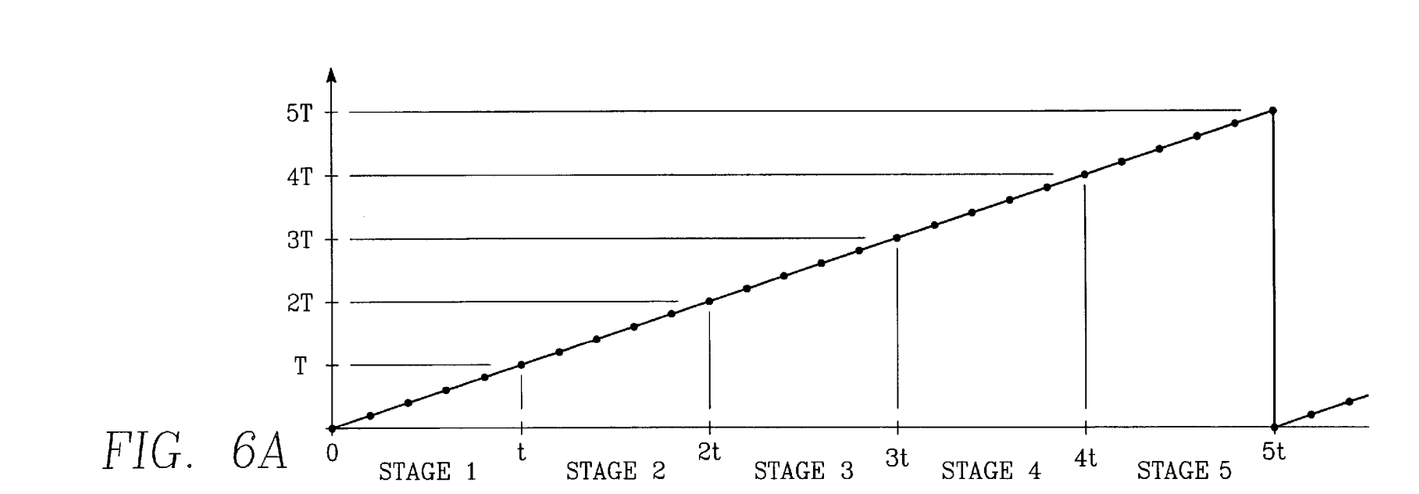
FIGS. 6A–6F are contemporaneous timing diagrams corresponding to FIG. 3.
Figure 6B:
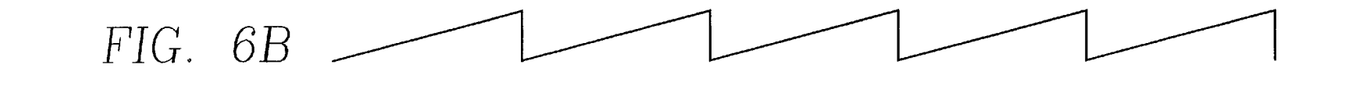
Figure 6C:
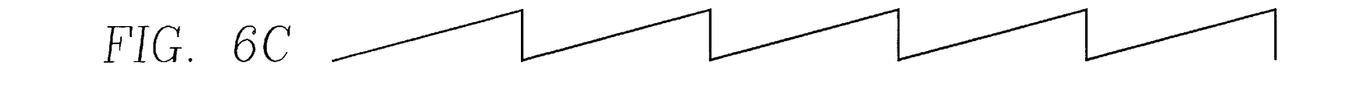
Figure 6D:
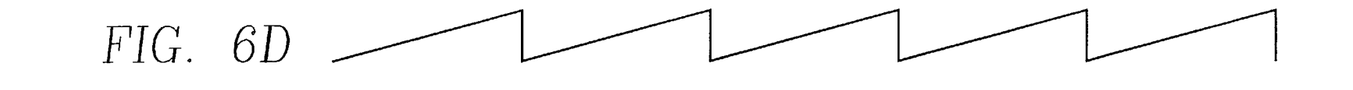
Figure 6E:
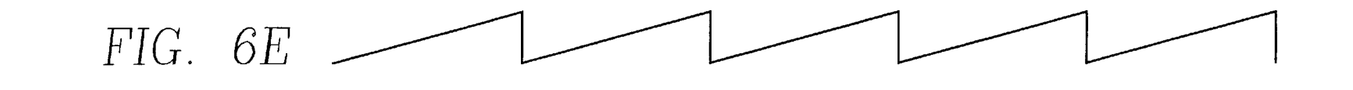
Figure 6F:
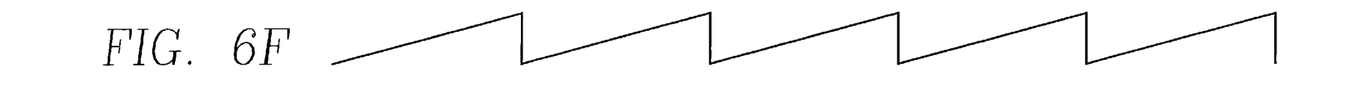

The timing diagrams of FIGS. 6A–6F provide a more thorough illustrations of the operation depicted in the timing diagram of FIG. 3. FIG. 6A illustrates how the start bit of successive data frames in the received signal could coincide with successive virtual stages of the local oscillator over time. The slope of the graph of FIG. 6A would correspond to the frequency difference between $f_{recvd}$ and $f_{osc}$, as discussed above with reference to FIG. 3. FIGS. 6B–6F coincide with FIG. 6A and show the delay commands issued simultaneously by the control circuit 130 to respective ones of the analog variable delays 115a–115e, in the manner of FIG. 3.

Figure 7:
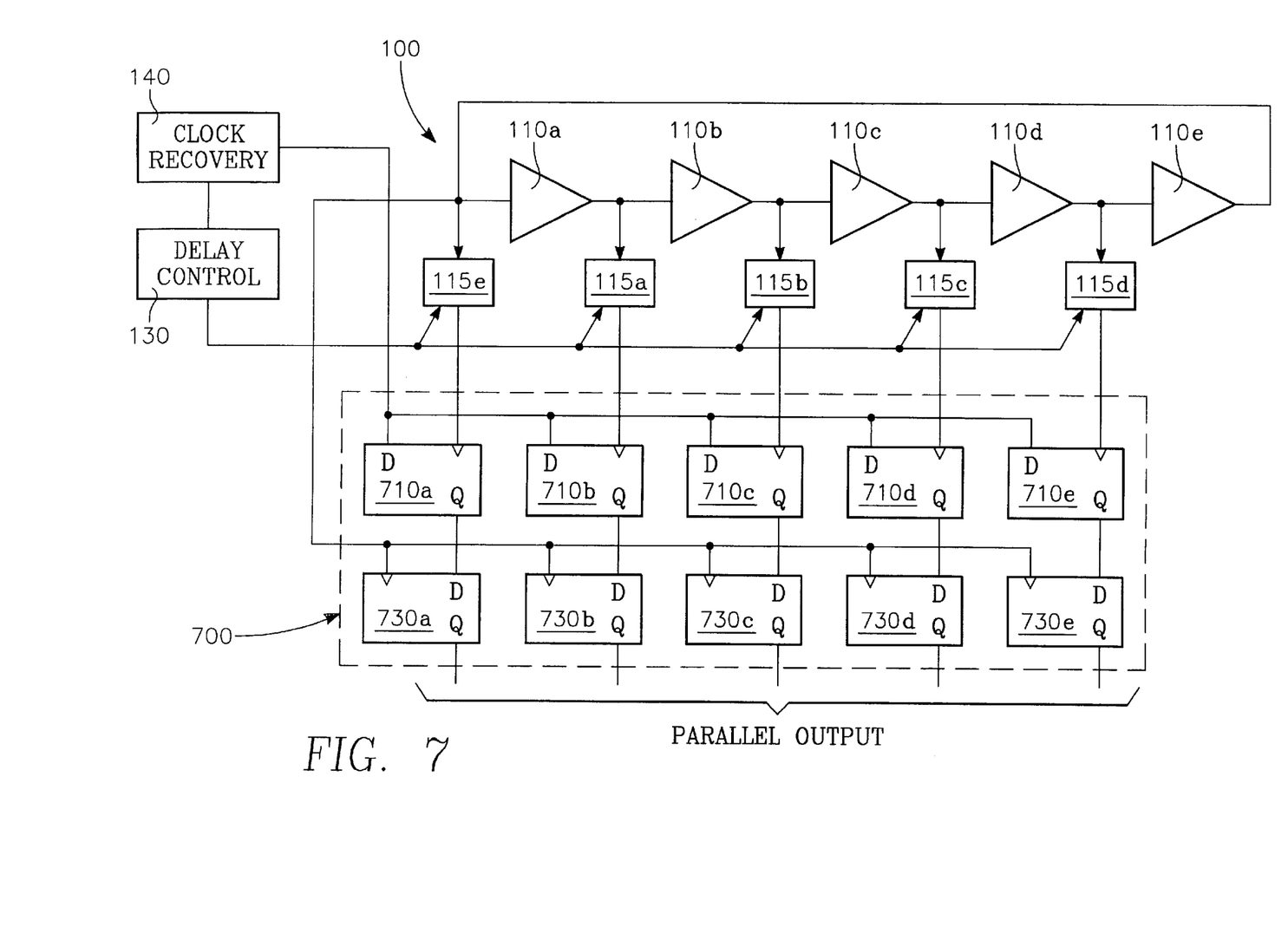

FIG. 7 illustrates an exemplary system embodying the invention, including a five-stage ring oscillator 100 with five inverting stages 110a–110e and five respective variable analog delays 115a–115e providing the five outputs of the oscillator 100 and acting as 5×m virtual oscillator stages. A control circuit 130 issuing commands to the analog delays 115a–115e responds to a conventional clock recovery circuit 140 that receives the incoming signal. FIG. 7 illustrates, in addition, a serial-to-parallel converter 700 that enables the incoming serial data stream constituting the received signal to be sampled with the outputs of the variable analog delays 115a–115e.

The serial-to-parallel converter 700 includes a first series of n D flip-flops 710a–710e having their clock inputs connected to the outputs of respective ones of the variable analog delays 115a–115e. The D inputs of the flip-flops 710a–710e are connected to the received serial data stream. The Q outputs of the flip-flops 710a–710e thus hold samples of the data stream corresponding to five equally spaced sampling times defined by the outputs of the five variable analog delays 115a–115e. These five samples are buffered for a single clock period of the local oscillator 100 by a second serial series of flip-flops 730a–730e. The D input of each of the second series of flip-flops 730a–730e is connected to the Q output of a respective one of the first series of flip-flops 710a–710e. Clock inputs of the second series of flip-flops 730a–730e are all connected to the output of the same oscillator stage, which in the illustrated example is the output of the last stage 110e. The outputs of the second series of flip-flops 730a–730e are the parallel output of the serial-to-parallel converter 700. In the embodiment of FIG. 7, the parallel output provides five successive samples of the incoming signal at the clock rate of the local oscillator 100.

Figure 8A:
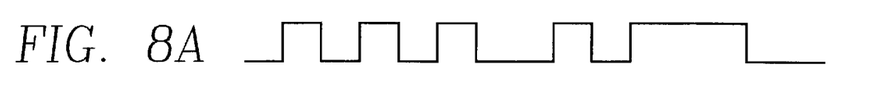
FIGS. 8A–8J are contemporaneous timing diagrams illustrating the operation of a series-to-parallel converter in the embodiment of FIG. 1.
Figure 8B:
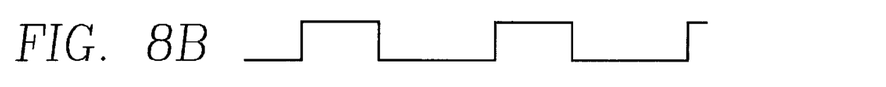
Figure 8C:
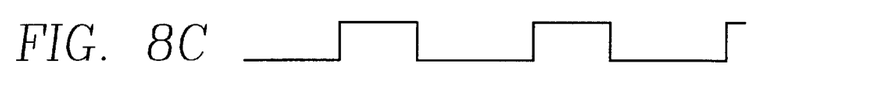
Figure 8D:
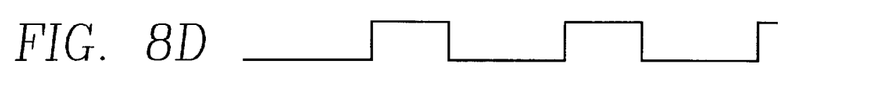
Figure 8E:
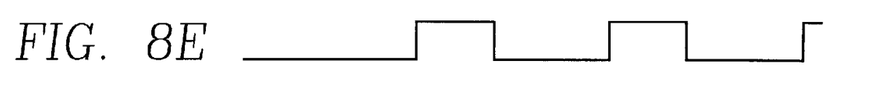
Figure 8F:
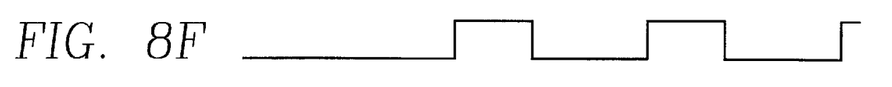
Figure 8G:
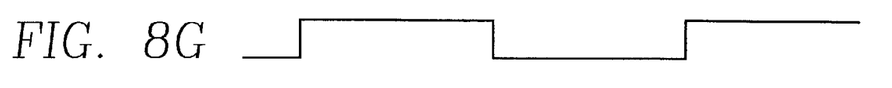
Figure 8H:
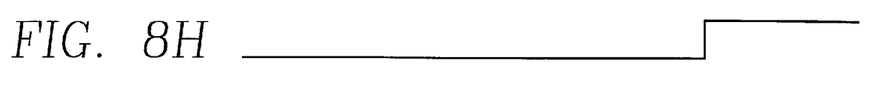
Figure 8I:
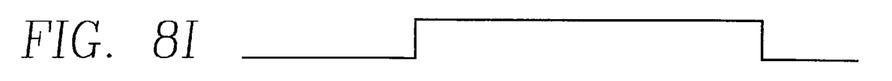
Figure 8J:
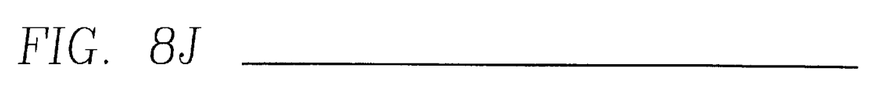

FIGS. 8A–8J are contemporaneous timing diagrams illustrating the operation of the serial to parallel converter 700 of FIG. 7. FIG. 8A depicts a brief portion of a received signal or serial data stream. FIGS. 8B–8F illustrate the outputs of the variable analog delays 115a–115e, respectively, which correspond to five successive periods of a recovered clock signal. FIGS. 8G–8J illustrate the corresponding outputs of the flip-flops 710a–710e corresponding to successive samples of the incoming data stream at the five recovered clock periods defined by the outputs of the five variable analog delays.

Figure 9:
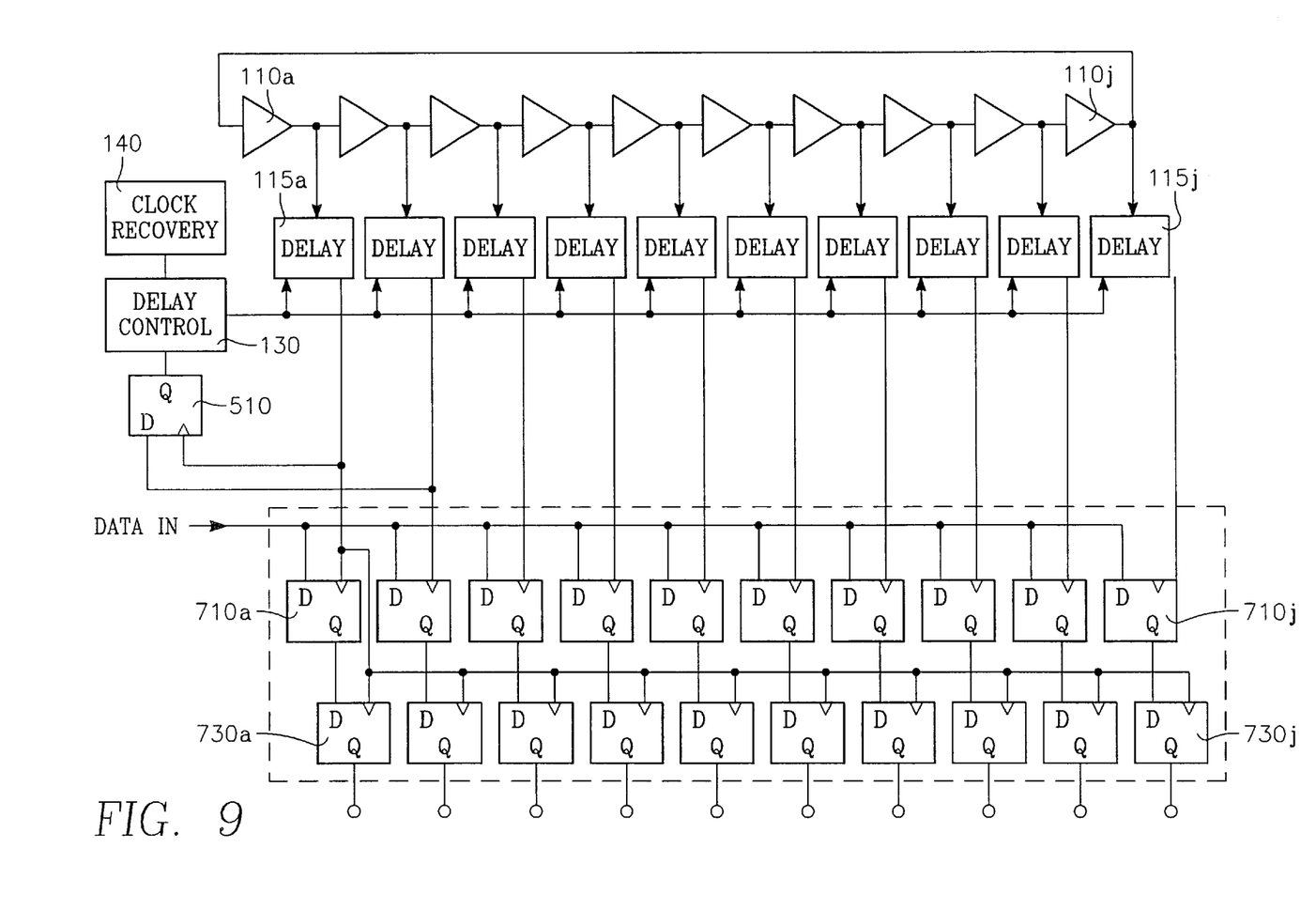
FIG. 9 is a schematic diagram illustrating a second embodiment of the invention.

While the invention has been described above with reference to embodiments having five local oscillator stages, the invention may be implemented with any suitable number of oscillator stages. For example, FIG. 9 illustrates, for example, an embodiment having ten oscillator stages 110a–110j and ten corresponding variable analog delays 115a–115j. The advantage of having more real oscillator stages 110 is that the oscillator frequency can be proportionately less than the embedded clock frequency to be recovered. In the example of FIG. 9, if the embedded clock frequency is 25 Gb/s, then the oscillator can run at the much lower frequency of 2.5 Gb/s, and can therefore be readily fabricated in standard Silicon technology to minimize cost.

The embodiment of FIG. 9 further includes a serial-to-parallel converter 700 having a first bank of ten D flip-flops 710a–710j and a second bank of ten D flip-flops 730a–730j. As in the serial-to-parallel converter of FIG. 7, the first series of n D flip-flops 710a–710j have their clock inputs connected to the outputs of respective ones of the variable analog delays 115a–115e. The D inputs of the flip-flops 710a–710j are connected to the received serial data stream. The Q outputs of the flip-flops 710a–710j thus hold samples of the data stream corresponding to ten equally spaced sampling times defined by the outputs of the ten variable analog delays 115a–115j. These ten samples are buffered for a single clock period of the local oscillator 100 by the second series of flip-flops 730a–730j. The D input of each of the second series of flip-flops 730a–730j is connected to the Q output of a respective one of the first series of flip-flops 710a–710j. Clock inputs of the second series of flip-flops 730a–730j are all connected to the output of the same oscillator stage, which in the illustrated example is the output of the last stage 110j. The D outputs of the second series of flip-flops 730a–730j are the parallel output of the serial-to-parallel converter 700. In the embodiment of FIG. 7, the parallel output provides ten successive samples of the incoming signal at the clock rate of the local oscillator 100.

The ten variable analog delays 115a–115j may be incremented and decremented by the control circuit 130 across the appropriate delay range in equal steps of any suitable size. For example, if the ten-stage ring oscillator 100 of FIG. 9 operates at 2.5 Gb/s, then the stage-to-stage phase difference or delay is 400 picoseconds, which is limit of the delay imposed by each variable analog delay 115. Moreover, if the control circuit 130 is programmed to step the variable analog delays 115 across the 400 picosecond delay range in 100 equal steps, then each step is 4 picoseconds. The number of virtual oscillator stages is then one thousand and the phase resolution is 4 picoseconds, in this example. The skilled worker can select different values for each of these parameters depending upon the appropriate system requirements.

While the invention has been described in detail with specific reference to preferred embodiments, it is understood that variations and modifications thereof may be made without departing from the true spirit and scope of the invention.

What is claimed is:

1. A high-speed clock generator for digital communication systems, comprising:
    a ring oscillator having n stages and n×m virtual stages, said virtual stages comprising n variable analog delays connected to corresponding ones of said n stages and having a delay that is variable over m equal steps within a delay range corresponding to a phase difference between adjacent ones of the n stages;
    a delay control circuit for selecting a delay value for the variable analog delays; and
    a comparator having a pair of inputs connected, respectively, to an output of one of said variable analog delays and to one of said n stages, said comparator further having an output connected to said delay control circuit, whereby said delay control circuit causes the delay value of said variable delays to cycle within said delay range.

2. The apparatus of claim 1 further comprising:
    a series-to-parallel converter having a first set of inputs to which outputs of said variable analog delays are connected and a second input to which a received signal is connected.

3. The apparatus of claim 2 further comprising a clock recovery circuit responsive to an embedded clock signal within said received signal for controlling said delay control circuit so as to frequency-lock the outputs of said variable analog delays to the embedded clock signal.

4. A high-speed digital communication receiver comprising:
    an oscillator of frequency f having a plurality of n stages connected serially having a delay of 1/(n×f) between successive stages;
    a plurality of n variable analog delays connected to respective ones of said n stages, outputs of said n variable analog delays providing n successive cycles of a clock signal of frequency n×f;
    a delay control circuit varying the delay interposed by each of said variable delays through a range of 1/(n×f); and
    a differential phase comparator having a pair of comparator inputs and an output connected to said delay control circuit, one of the comparator inputs being connected to an output of a selected one of said variable analog delays and the other of said comparator inputs being connected to one of the stages.

5. The apparatus of claim 4 wherein said differential comparator comprises a flip-flop, wherein the one comparator input is a D input of the flip-flop and the other comparator input is a clock input of the flip-flop, and said comparator output being a Q output of said flip-flop.

6. The apparatus of claim 4 further comprising a clock recovery circuit responsive to an embedded clock signal within said received signal for controlling said delay control circuit so as to frequency-lock the outputs of said variable analog delays to the embedded clock signal.

7. The apparatus of claim 6 wherein said clock signal frequency n×f is in the range of multi-Gigabits per second.

8. The apparatus of claim 7 wherein said oscillator comprises silicon integrated circuit elements.

9. The apparatus of claim 4 wherein said delay control circuit is programmed to return each of said variable analog delays to an initial delay value after the phase of the output of each variable analog delay reaches the phase of an adjacent oscillator stage.

10. The apparatus of claim 9 wherein said delay control circuit causes a delay value of each variable analog delay to cycle through a count modulus 1/(m×n×f).

11. The apparatus of claim 10 wherein said control circuit is programmed to cause delay values of said variable analog delays to count up modulo 1/(m×n×f) whenever the clock frequency is less than a frequency of the embedded clock signal and to count down modulo 1/(m×n×f) whenever the clock frequency is greater than a frequency of the embedded clock signal.

12. The apparatus of claim 11 wherein said delay control circuit is a microprocessor.

13. A ring oscillator having n stages and n×m virtual stages, said virtual stages comprising n variable analog delays connected to corresponding ones of said n stages and having a delay that is variable over m equal steps within a delay range corresponding to a phase difference between adjacent ones of the n stages.

14. The ring oscillator of claim 13 further comprising:
    a delay control circuit for selecting a delay value for the variable analog delays; and
    a comparator having a pair of inputs connected, respectively, to an output of one of said variable analog delays and to one of said n stages, said comparator further having an output connected to said delay control circuit, whereby said delay control circuit causes the delay of said variable analog delays to cycle within said delay range.

* * * * *